United States Patent [19]

Kukanskis

[11] Patent Number: 4,459,184

[45] Date of Patent: Jul. 10, 1984

[54] METHOD FOR CONTINUOUS METAL DEPOSITION FROM A NON-AUTOCATALYTIC ELECTROLESS PLATING BATH USING ELECTRIC POTENTIAL

[75] Inventor: Peter E. Kukanskis, Woodbury, Conn.

[73] Assignee: MacDermid, Inc., Waterbury, Conn.

[21] Appl. No.: 391,985

[22] Filed: Jun. 25, 1982

Related U.S. Application Data

[63] Continuation of Ser. No. 177,486, Aug. 12, 1980, abandoned.

[51] Int. Cl.$^3$ .......................... C25D 5/54; C25D 3/38
[52] U.S. Cl. ................................. 204/30; 204/38 B; 204/52 R
[58] Field of Search ................ 204/20, 30, 38 B, 52 R

[56] References Cited

U.S. PATENT DOCUMENTS

| | | | |
|---|---|---|---|
| 3,597,266 | 8/1971 | Leibowitz | 204/38 B X |
| 4,086,149 | 4/1978 | Martinsons | 204/59 R |
| 4,099,974 | 6/1978 | Morishita | 106/1.23 |
| 4,209,331 | 6/1980 | Kukanskis | 106/1.23 |

FOREIGN PATENT DOCUMENTS

| | | | |
|---|---|---|---|
| 1222969 | 2/1971 | United Kingdom | 204/38 B |
| 1288620 | 9/1972 | United Kingdom | 204/38 B |

OTHER PUBLICATIONS

F. A. Lowenheim, *Electroplating*, McGraw-Hill Book Co., New York, 1978, pp. 12–13.

*Primary Examiner*—G. L. Kaplan
*Assistant Examiner*—William T. Leader
*Attorney, Agent, or Firm*—St. Onge, Steward, Johnston & Reens

[57] ABSTRACT

A method of continuously depositing a metallic plating on the surface of a workpiece from a non-autocatalytic electroless plating bath that is normally inherently self-limiting as to the thickness of metal which can be deposited by electrolessly plating by applying an electric potential on the workpiece in the electroless bath. The method provides non-autocatalytic baths, such as hypophosphite-reduced electroless copper baths, with the ability to plate on nonconductors to a desired thickness which increases with time at a rate dependent on the amount of current applied. A more uniform thickness of deposit over the workpiece being plated and greater deposit penetration into blind holes, deep recesses and tubular portions of complex-shaped parts is obtainable by the method.

9 Claims, No Drawings

METHOD FOR CONTINUOUS METAL DEPOSITION FROM A NON-AUTOCATALYTIC ELECTROLESS PLATING BATH USING ELECTRIC POTENTIAL

This is a continuation of application Ser. No. 177,486, filed Aug. 12, 1980, now abandoned.

BACKGROUND OF THE INVENTION

1. Field of the Invention

This invention relates to the electroless deposition of metal from non-autocatalytic electroless plating baths that are inherently self-limiting as to the thickness of metal which can be deposited. In particular, this invention relates to the electroless deposition of copper from non-autocatalytic electroless copper plating baths utilizing a reducing agent to reduce copper ions dissolved in the solution to metallic copper to provide metal deposits or films on a suitably prepared substrate contacted by the bath solution. An example of such a copper plating bath is disclosed in U.S. patent application Ser. No. 909,209, filed May 25, 1978, now U.S. Pat. No. 4,207,331 and assigned to the assignee of the present application.

In application Ser. No. 909,209, hypophosphite is disclosed as a reducing agent which is useful as a reducer for copper ions in electroless plating baths. The hypophosphite reduced copper system is inherently non-autocatalytic to copper, in contrast to presently known formaldehyde reduced systems which are inherently autocatalytic to copper, and thus results in copper depositions of limited thickness.

2. Description of the Prior Art

In U.S. patent application Ser. No. 964,128, filed Nov. 27, 1978, now U.S. Pat. No. 4,265,943 and assigned to the assignee of the present application, there is disclosed an invention which overcomes the self-limiting nature of a hypophosphite reduced and similar non-autocatalytic copper system so as to provide continuous plating, that is, plating to a desired thickness which increases with time at a substantially constant rate of metallic copper when utilizing a non-formaldehyde type reducing agent, electroless copper plating bath. Such is achieved, in the invention disclosed in application Ser. No. 964,128, by including, in the system, a source of non-copper ions, preferably nickel or cobalt ions. The plating obtained in that invention is said to be essentially that of copper with only small quantities of the non-copper metal being codeposited with copper. The codeposited metal is said to function as an autocatalysis promoter so that metallic copper deposits or films of a desired thickness, greater than the limiting thickness obtainable before, are obtained as a continuous plating step, that is, as a plating operation wherein the plating thickness increases with time at a substantially constant rate.

The discussion of the prior art in application Ser. Nos. 909,209 and 964,128, referred to above, both of which are incorporated by reference herein, reveals that it was surprising and unexpected that a non-formaldehyde type reducing agent such as hypophosphite, would successfully reduce copper ions to metallic copper for electroless deposition while yielding advantages not previously available in typical formaldehyde reduced systems and that the self-limiting nature of the hypophosphite reduced system could be overcome by the addition of nickel or cobalt ions so that the system was no longer non-autocatalytic.

Plating processes wherein electrolytic current is used in conjunction with electroless plating are known. For example, U.S. Pat. No. 2,644,787 discloses a combination of electroplating and chemical plating, in a bath containing nickel, cobalt and hypophosphite ions, onto a conductive substrate to produce a magnetic coating. The patent discloses current densities of 10 to 200 amps per sq. ft. in a bath solution having a pH from 2 to 6, and states that the process yields deposits in excess of those expected from the current flow.

U.S. Pat. No. 3,264,199 describes a process for depositing nickel coatings on a metallic object by an autocatalytic chemical reduction reaction in a bath containing nickel salt and hypophosphite. The uniformity of the rate of the electroless deposition process is said to be materially aided by the addition of superimposed direct current pulses at periodic intervals. The patent further states that the current provides an electrochemical action acting as an aid to the chemical reduction process and, in effect, increase the rate of deposition of the electroless process but that the addition of a small current density does not increase the rate due to an electroplating action.

In U.S. Pat. No. 3,303,111 there is described a process for depositing nickel on a metal surface from a nickel-hypophosphite bath using AC or DC current to speed up the deposition of nickel. The patent states that the process is not one of electroplating, but, rather, is one in which the applied current apparently supplements the galvanic potential of the hypophosphite and excites it to do work which it could not do without such supplemental energy.

U.S. Pat. No. 3,485,725 discloses controlling the rate of deposition of metal on to a non-metallic substrate from an electroless plating bath by impressing an electric potential on the surface of the substrate. An example in the patent shows the use of current in an autocatalytic nickel or cobalt-hypophosphite bath to increase or decrease plating rate. It is said that this results in a unique phenomenon in that more plate is achieved than expected from a yield based on the sum of the electroless and electrolytic action.

British Pat. No. 1,222,969 discloses a process of depositing a metal layer onto a substrate by an electroless plating process in an autocatalytic electroless plating bath followed by an electroplating process without removing the substrate from the plating solution.

The various patents discussed above disclose the use of an electric current in electroless copper, nickel or cobalt baths, all of which are autocatalytic. Thus, in the patents, the bath compositions disclosed invariably employ formaldehyde type reducing agents for copper formulations and hypophosphite type reducing agents for nickel formulations, similar to the disclosures made in the prior art discussed in application Ser. Nos. 909,209, and 964,128.

The electroless plating and electrolytic plating disclosed in the above patents continue concurrently with the electric current being employed primarily to boost the plating rate. The patents are silent with respect to electroless plating baths which are non-autocatalytic and inherently self-limiting as to plating thickness, such as the hypophosphite reduced bath disclosed in application Ser. No. 909,209. In contrast to formaldehyde reduced copper solutions and hypophosphite reduced nickel solutions, hypophosphite reduced copper solutions are not autocatalytic so that catalyzation ceases when the surface of the substrate is covered with a deposit at about 10 micro inches thick.

It is generally necessary to build up plate thicknesses greater than 10 micro inches for commercial uses. Even where conventional electroplating is to follow electroless plating to build plate thickness, such procedure is not commercially acceptable in many instances where the initial deposit obtained by electroless plating is too thin.

For example, when workpieces are removed from a non-autocatalytic electroless plating bath that has been self-limiting as to thickness so that a thin plating only has been obtained, there is the possibility that the connection between the parts or workpieces and the plating rack or fixtures will be broken, thus destroying the conductor bridge necessary to get electric current to the part. This increases the incidence of burnoff in subsequent electroplating.

Another possible disadvantage is the possibility of bipolar deplating due to the thin deposit. Bipolar deplating occurs where a low current density area of a workpiece becomes anodic, due to the limited current carrying capability of the thin deposit, to an adjacent area of the piece which is cathodically plating. This can cause dissolution of the thin anodic electroless deposit which, if too thin, can be completely stripped away.

In addition, workpieces that have been electrolessly plated with a thin deposit and stored prior to electroplating may require reactivation prior to plating by techniques which might remove copper which cannot be spared by thin deposits. Also, processes which require intermediate operation, such as imaging techniques in the manufacture printed circuits, often require greater copper thickness than can be provided in non-autocatalytic baths which are inherently self-limiting as to thickness.

While the method and composition disclosed in application Ser. No. 964,128 overcome the disadvantages discussed above, the plating obtained contains a minor amount of the noncopper ion, such as nickel or cobalt, added to the plating solution. In addition, the system provides for continuous plating, wherein the plating thickness increases with time at a substantially constant rate as a consequence of the deposit becoming autocatalytic, through a chemical change, that is, a change in the composition of the plating bath such as by the addition of nickel and cobalt. Thus, there exists a need for alternate means to overcome the disadvantages of non-autocatalytic electroless plating baths discussed above.

SUMMARY OF THE INVENTION

This invention overcomes the drawbacks associated with electroless plating baths which inherently result in self-limiting thickness of deposit while retaining the principal advantages of such baths. By self-limiting thickness of deposit is meant that the bath is non-autocatalytic and the electrolessly deposited metal ceases to catalyze further reduction of metal ions in the bath after a period of time.

The foregoing is achieved, according to this invention, by a method which allows build-up of any desired deposit thickness in previously self-limiting electroless plating baths by applying an electric potential on the substrate to be plated in such baths. The thickness increases at a rate of deposition dependent on the amount of current applied and which thus can be controlled, by varying the current density applied, to obtain a substantially constant rate which, if desired, may be essentially the same as the initial rate of deposition.

The electroless metal plating baths employed in the method of this invention, preferably copper baths, are formulated to be non-autocatalytic as a consequence of which the usual problems associated with electroless baths may be avoided. One advantage of such non-autocatalytic baths is that they are more stable and have a greater tolerance to changes inevitably encountered in practical commercial operation. For example, non-autocatalytic plating baths allow wider operating parameters in terms of component concentration, temperature, plating time and similar bath variables such that the parameters are commercially acceptable.

Another advantage of the non-autocatalytic baths which can be successfully commercially employed through the method of this invention is that the metal to be deposited plates out onto catalyzed surfaces only. In typical autocatalytic baths, the metal to be deposited plates out on every surface, including tanks, filters and other associated equipment. As a result, considerable time and money must be spent to strip metal off extraneous surfaces. Non-autocatalytic baths do not require this maintenance. In addition, the use of non-formaldehyde reducers in such baths eliminates the harmful environmental effects associated with the toxic and irritating fumes of formaldehyde.

Accordingly, a feature of this invention is the provision of a method which overcomes the inherently self-limiting thickness of deposit of non-autocatalytic electroless plating baths.

Another feature of this invention is the provision of a method for continuous plating to obtain deposits of any desired thickness of copper using non-autocatalytic electroless copper plating baths.

The present invention provides non-autocatalytic baths with the ability to plate on nonconductors to a desired thickness with the application of current to the nonconductor to make possible the use of such non-autocatalytic baths where they would otherwise be commercially unsatisfactory. It is both surprising and unexpected that the plating obtained using the method of this invention in a hypophosphite reduced copper bath results in a very uniform thickness over the entire workpiece being plated. That is, in normal electroplating baths the high current density areas plate more thickness than do the low current density areas, a differential which can be substantial. By contrast, the electrolytic action of the method of this invention, through the application of current to hypophosphite reduced electroless copper baths, provides a means for achieving a greater deposit penetration into blind holes, deep recesses and tubular parts resulting in a more uniform deposit.

In the case of plating nonconductors with complex shapes, problems of bipolar plating in recesses or other low current density areas which can occur in subsequent electroplating operations, as discussed above, may be avoided using the method of this invention.

A further feature of this invention is the provision of a method for electroless copper plating by which continuous plating of metallic copper is achieved in a non-autocatalytic copper bath system to achieve copper deposits of desired thickness by applying an electric potential on the substrate or workpiece being plated in the bath.

Yet another feature of this invention is the provision of a plated workpiece obtained by the method described above.

The foregoing and other features, advantages and objects of this invention will become further apparant from the following description of preferred embodiments thereof.

DESCRIPTION OF THE PREFERRED EMBODIMENTS

Representative of the electroless baths having the feature of inherent self-limiting thickness of deposit by chemical reduction which can be advantageously utilized in this invention are such as those disclosed in application Ser. No. 909,209. The plating solutions include the usual major categories of components of electroless copper baths such as a solvent, usually water, a source of cupric ions, a complexing agent, the non-formaldehyde type reducing agent, preferably a soluble source of hypophosphite and, where required, a pH adjuster. The concentrations of the various constituents and other operating parameters of the electroless bath are such that they provide a conductive metal film over a suitably catalyzed non-conductive substrate.

The workpiece, that is the substrate part to be plated, is attached to a fixture, such as a rack, capable of carrying electric current. Typical plating racks manufactured from copper and stainless steel and normally coated with a plastisol protective coating are suitable. The parts to be plated, which are attached to the plating rack, are processed through a preplate process to prepare the non-conductive substrate for electroless deposition.

Typical preplating processes commonly known to those skilled in the electroless plating art can be employed. For example, in processing plastic such as ABS for decorative plating applications the usual chromic acid based etchant is used to etch the plastic, followed by the usual neutralization, preactivation or conditioning steps, catalyzation, such as by using paladium-tin solutions, and acceleration, with the typical water rinsing steps following each. For processing printed circuit boards, the typical solutions associated with preparing those substrates for electroless plating are used.

After the substrate material bearing the catalyzed non-conductive surface has been processed suitably to accept electroless deposition, it is ready for immersion in the electroless plating bath. Upon immersion in the electroless plating bath, a chemical reduction reaction occurs producing adherent conductive metal film over the non-conductive substrate. As the deposited metal builds, the noncatalytic nature of this deposited metal prevents further chemical deposition at which point the self-limiting thickness is realized.

According to the method of this invention, a negative potential electric current is applied through the conductive plating rack to which the parts to be plated are attached. The current is carried to the metal film on the substrate part resulting in electric deposition of metal on the substrate and allowing for buildup of a deposit of desired thickness. The electric current may be applied to the plating rack immediately upon immersion in the electroless bath or at any time thereafter. However, the non-conductive substrate will not carry the current until sufficient metal is deposited by chemical reduction to enable the electric effect to be realized.

In order to apply the electric current an electric circuit must be completed by immersing electrodes, in this case anodes, in or in contact with the electroless plating bath. Many types of anode materials may be used successfully including insoluble anodes such as those made of carbon graphite, stainless steel, or platinized titanium. Soluble anodes, such as copper, may also be used. A soluble anode of copper may be advantageously used in copper baths because the oxidation effect can be a source of cupric ions to maintain the dissolved copper concentration in the electroless bath at the desired level. An advantageous anode area is selected such that it results in a one-to-one ratio with the cathode, that is, plating deposit, area.

The preferred amount of current applied ranges from about 0.03 to 10 amps per sq. ft. of processing, that is, plating, area. Current densities lower than 0.03 amps per sq. ft. may be inadequate to deposit metal in a reasonable time. Current densities greater than 10 amps per sq. ft. may result in poor deposits of metal, especially on corners or sharp edges of the plated parts.

The following examples illustrate preferred conditions for practicing the invention.

EXAMPLE 1

In this example, a series of $3 \times 3\frac{1}{2}$ inch test plaques molded of standard commercial plating grade ABS were first processed in a chemical using a chromicsulfuric acid mixture following the operating conditions, concentration, and time of treatment disclosed in U.S. Pat. No. 3,515,649. Following thorough rinsing and neutralization of residual chromic acid, the plaques are catalyzed in the known "one-step" method using a mixed palladium-tin catalyst of commercial type disclosed in U.S. Pat. No. 3,352,518.

After rinsing, the catalyzed plaques are placed in an accelerating solution to activate the catalyzed surface making it more receptive to electroless deposition. Many types of accelerating baths may be employed, for example the one disclosed in U.S. Pat. No. 3,352,518. Such accelerating baths generally comprise an acid solution although alkali accelerators, such as sodium hydroxide solution, have also been used successfully. The plaques are then ready, after further rinsing, for copper plating.

The copper bath used in this example has the following composition:

| | |
|---|---|
| $CuCl_2 \cdot 2H_2O$ | 0.12 M (20 g/l) |
| "Hampol" (HEEDTA) | 0.148 M (56 g/l) |
| $NaH_2PO_2 \cdot H_2O$ | 0.34 M (36 g/l) |
| Water | to make one liter |

The pH is adjusted, using hydrochloric acid or sodium hydroxide, to a pH of approximately 9.0. The bath is maintained at a temperature of 140° to 150° F. (60° to 66° C.).

The ABS plaques are placed in a plating rack and immersed in the electroless plating bath. Shortly after the plaques are immersed in the bath, an adherent copper film forms on the catalyzed ABS surface. Electric current is applied to the plating rack holding the plaque and begins to register current flow as the electroless copper film builds. The circuit is completed using a carbon anode which is also immersed in the plating bath and connected to the positive terminal of a plating rectifier which supplies the current. Runs were made using various immersion times and various current densities and the deposit thickness measured. The results are set forth in Table 1.

Table 1 shows results of the thickness of copper deposit obtained with and without electric current as well as at various times and current densities. The results illustrate the self-limiting nature of the electroless bath when no current is applied. The particular formulation of this bath allows for a plate thickness of about 12 to 13 micro inches which discontinues regardless of the length of immersion. The results show that use of current give a linear increase in deposit thickness at a given current density for increasing immersion time. It also illustrates that for a given immersion time, deposit thickness increases with increasing current density.

EXAMPLE 2

A second series of test plaques molded of a standard commercial grade of ABS were processed identically as in Example 1. In this example, an electroless copper bath identical in all respects to that of Example 1 was used, except that the complexor, Hampol (HEEDTA) in the electroless bath was changed to "Hampene Na4" (tetrasodium EDTA) at the same concentration of 0.148 Moles. The results obtained were nearly identical to those of Example 1 and show approximately the same deposit thicknesses. The only significant difference was that the self-limiting deposit thickness in this example with no current application was about 9 to 10 microinches for the EDTA as opposed to the 12 to 13 microinches obtained with the HEEDTA in Example 1.

TABLE 1

| Current Density Amps/sq.ft. | Immersion Time | | | | | |
|---|---|---|---|---|---|---|
| | 5 min. | 10 min. | 15 min. | 30 min. | 60 min. | 120 min. |
| | Deposit Thickness in Micro Inches | | | | | |
| .03125 | 9.75 | 12.67 | 13.46 | 13.69 | 16.18 | 16.42 |
| .0625 | 9.87 | 12.91 | 13.82 | 13.91 | 17.62 | 20.30 |
| .125 | 10.19 | 13.55 | 14.79 | 16.35 | 21.50 | 28.07 |
| .25 | 10.72 | 14.61 | 16.38 | 19.54 | 27.89 | 40.83 |
| .5 | 11.81 | 16.79 | 19.65 | 26.07 | 40.94 | 66.95 |
| 1.0 | 13.77 | 20.71 | 25.52 | 37.81 | 64.42 | 113.90 |
| 2.0 | 19.24 | 31.65 | 41.93 | 70.63 | 130.06 | 245.19 |
| 4.0 | 27.74 | 48.65 | 67.43 | 121.63 | 232.06 | 449.18 |
| 8.0 | 48.53 | 90.23 | 129.80 | 246.37 | 481.54 | 948.14 |
| 10.0 | 87.50 | 168.17 | 246.71 | 480.19 | 949.18 | 1883.42 |
| No Current | 9.75 | 12.31 | 12.92 | 12.61 | 14.02 | 13.01 |

EXAMPLE 3

A variety of typical automotive components molded from both a commercial plating grade ABS and from commercial plating grade polyphenylene oxide (Noryl) were processed through preplate cycles as described in Example 1. A preactivator step was utilized for processing the Noryl components. The parts were processed through an electroless copper bath as described in Example 1. Current was applied at a variety of current densities and immersion times giving deposit thicknesses varying from 15 to 100 microinches. These parts were then processed through standard electroplating baths of bright acid copper, bright nickel, and chrome plate to give a finished decorative chrome plated part. Adhesion tests of the metal to the plastic substrate gave adherence values of about 8 to 10 lb/in., a value typically obtained with commercial autocatalytic electroless plating techniques. Thermal cycling and corrosion (CASS) testing performed on the parts demonstrates that presently established automotive specifications are met.

EXAMPLE 4

ABS plastic parts molded in the shape of a cone having an internal recess approximately 2.5 centimeters deep were processed through a preplate process as described in Example 1 to catalyze the surface making it ready for electroless deposition. Two parts were immersed in a "Bath A", having the composition given below, for 10 minutes without using any current to give approximately 12 microinches of a uniform electrolessly deposited copper over the parts.

| | Bath A | Bath B |
|---|---|---|
| CuCl$_2$2H$_2$O | 0.12 Moles | 0.12 Moles |
| "Hampol" (HEEDTA) | 0.148 Moles | 0.148 Moles |
| NaH$_2$PO$_2$H$_2$O | 0.34 Moles | 0.00 Moles |
| Water | to make one liter | |
| pH adjusted (HCl or NaOH) | pH 9.0 | pH 9.0 |
| Temperature | 145° F. | 145° F. |

One part was removed from Bath A, its deposit weight measured, and immersed in a "Bath B" having the composition given above. Each bath had its pH adjusted to approximately 9.0, was at a temperature of 145° F. and contained a carbon anode connected to a supply of electric current.

The electrolessly plated parts were then made cathodic in their respective baths, Bath A and Bath B, using an average current density of about 8 amps per square foot while tied to a circuit with a copper coulometer. After a period of 90 minutes of plating time, both parts were removed and the weight of deposited copper on each was measured. The weights of copper deposited on each part due to the electrolytic action were approximately the same and were between 98 and 100% efficient.

Two other sets of identical ABS cones were processed as described above. Each cone was cross sectioned and the copper thickness deposited in the deepest internal recess of the cone was measured microscopically. The results are set forth in Table 2.

TABLE 2

| Bath A | Bath B | |
|---|---|---|
| 735 microinches | 611 microinches | Inside of cone facing toward carbon anode |
| 615 microinches | 427 microinches | Inside of cone facing away from carbon anode |

Since the weight of copper deposited on each cone was about the same using either Bath A or Bath B with electric current, and since Bath A shows a greater deposit thickness in the deep recess of the cone, a low current density area, the results demonstrate that the electroless bath (Bath A containing the hypophosphite reducing agent) affords more uniform distribution of plate.

A further study of this surprising result of mere uniform distribution of plates was made using flat panels at controlled current densities of 0.03125, 0.0625, 0.125, 0.25, 0.5, 1.0, 2.0, 4.0, 8.0 amps per square foot. The flat panels were processed identically to the cones described above, and plated for an equivalent amount of ampere-minutes at each current density. The amount of copper deposited in both Baths A and B remained approximately equivalent from 8 amps per sq. foot down to about 0.25 amps per sq. foot at which time the amount of copper deposited from Bath B (without reducing agent) fell giving only 50 percent of the amount deposited by Bath A at a current density of 0.03125 amps per square foot. This further demonstrates that the electroless bath (Bath A containing sodium hypophosphite) gives better efficiency at lower current densities than the non-electroless bath (Bath B containing no sodium hypophosphite). This would advantageously result in more uniform deposits on complexly shaped parts.

EXAMPLE 5

Another series of test plaques were processed identically as described in Example 1 except a copper anode was used in place of the carbon anode of Example 1. Similar results were obtained.

EXAMPLE 6

Another series of test plaques were processed identically as described in Example 1 except a 316 stainless steel anode was used in place of the carbon anode of Example 1. Similar results were obtained.

EXAMPLE 7

Standard 1 oz., two sided, copper-clad, FR-4, epoxy glass laminate board was drilled to obtain holes ranging from 10 to 50 thousandths of an inch in diameter. The laminate was then processed in a commercial plated through hole (PTH) cycle to prepare the hole walls and laminate surface for electroless deposition. The PTH cycle uses a series of cleaning and etching steps, followed by catalyzation with tin-palladium, and accelerator steps similar to those used for plating ABS plastic.

The catalyzed board was then immersed in an electroless copper bath as described in Example 1. The board was made cathodic with a current density of about 6 amps per square foot and left in solution for 15 minutes, at which time the board was removed from the electroless bath, rinsed, and dried. Inspection of the hole walls revealed a uniform coating of copper about 100 microinches in thickness. The copper deposit completely covered the epoxy and glass fibers of the hole walls with no voiding of deposit evident.

The laminate board was further processed to produce a finished circuit board. After the PTH process the dried board was imaged with a plating resist leaving exposed the desired circuit traces and holes. Imaging of the plating resist can be accomplished with silk screening, or photo chemical technique as is known. The board was then processed through solutions which cleaned and pickled the exposed circuit traces and holes in preparation for further electroplating. The circuit traces and holes were plated with an acid copper plating solution to a thickness of about 1 thousandth of an inch, followed by solder plate to a thickness of about 0.2 thousandths of an inch. Next the plating resist was chemically removed and the copper cladding chemically stripped away yielding a finished circuit board with copper and solder plated circuit traces and holes.

The finished board was then tested for "solder shock" by an immersion in 500° F. molten solder for 10 seconds. The holes were then cross-sectioned and examined under a microscope revealing a well plugged solder hole, the copper deposit remaining completely intact through the hole wall.

While the invention finds particularly advantageous utilization in hypophosphite reduced electroless copper plating baths, the invention is useful generally for any non-autocatalytic electroless metal plating bath which inherently results in self limiting thicknesses of deposit. Although non-formaldehyde reduced electroless copper plating systems, such as the hypophosphite reduced system described, are representative, it is to be understood that the invention is applicable to any non-autocatalytic electroless plating system exhibiting self-limiting thicknesses of deposit, irrespective of the reducing agent used. Applying a negative potential of electric current on the substrates in such baths will result in a metal deposit thickness greater than that which can be achieved by the electroless plating reaction alone. Thus, although specific embodiments of the invention have been described above in detail, those are primarily for purposes of illustration. Modification may be made to the particular conditions and components disclosed herein, consistent with the teaching herein, without departing from the invention, as will be apparant to those skilled in the art, for adaption to particular requirements.

What is claimed is:

1. A method of continuously depositing a metallic copper plating on the surface of a workpiece comprising the steps of preparing the surface of the workpiece to render it more receptive to the plating, immersing the workpiece in a solution comprising, in addition to water, a soluble source of copper ions, a complexing agent to maintain the copper ions in solution, a reducing agent comprising a soluble source of hypophosphite ions effective to reduce the copper ions to form a metallic copper deposit on the surface of the workpiece when in contact with the solution, the solution being one which is non-autocatalytic and normally inherently produces a metallic deposit of self-limiting thickness, obtaining an electrolessly deposited metallic copper plating on the workpiece through the reduction of the copper ions, applying an electric current of negative potential to the workpiece to render it cathodic while immersed in the solution, completing an electrical circuit by placing an anode in effective electrical contact with the solution, obtaining an electric deposition of copper on the workpiece on the electroless metallic deposition, and depositing copper plating on the workpiece at a thickness which increases with time of immersion in the solution with a substantially constant rate of deposition.

2. A method of continuously depositing a metallic copper plating on the surface of a workpiece as claimed in claim 1 wherein the electric current applied to the workpiece has a current density ranging from 0.03 to 10 amps per square foot of processing area.

3. A method of continuously depositing a metallic copper plating on the surface of a workpiece as claimed in claim 1 wherein the workpiece has a catalyzed non-conductive surface prior to immersion in the solution.

4. A method of continuously depositing a metallic copper plating on the surface of a workpiece as claimed in claim 1 wherein the electric current is not applied until the electroless deposit on the workpiece has reached its self-limiting thickness.

5. In a method of electrolessly depositing a copper plating on the surface of a workpiece comprising the steps of preparing the surface of the workpiece to render it more receptive to the plating, immersing the workpiece in a solution comprising, in addition to water, a soluble source of cupric ions, a complexing agent to maintain the cupric ions in solution, and a soluble source of hypophosphite ions effective to reduce the cupric ions to metallic copper as a deposit on the surface of the workpiece when in contact with the solution, the improvement therein enabling continuous deposition of the copper plating on the workpiece at a thickness which increases with time of immersion of the workpiece in the solution with a substantially constant rate of deposition comprising applying a negative potential of electric current on the workpiece to render it cathodic while immersed in the solution and completing an electrical circuit by placing an anode in effective electrical contact with the solution.

6. The improved method as claimed in claim 5 wherein the electric current has a current density ranging from 0.03 to 10 amps per square foot of processing area.

7. The improved method as claimed in claim 5 wherein the electric current is not applied until the workpiece has had a metallic copper plating electrolessly deposited on it.

8. The improved method as claimed in claim 7 wherein the electric current is applied when the electrolessly deposited metallic copper plating has reached a self limiting thickness.

9. The improved method as claimed in claim 5 wherein the workpiece has a catalyzed non-conductive surface prior to immersion.

* * * * *